United States Patent
Whikehart et al.

(12) 
(10) Patent No.: US 6,469,632 B1
(45) Date of Patent: Oct. 22, 2002

(54) COMPONENT SELECTOR ASSEMBLY

(75) Inventors: J. William Whikehart, Novi, MI (US); Terry Robert Altmayer, Monument, CO (US)

(73) Assignee: Visteon Global Tech., Inc., Dearborn, MI (US)

(*) Notice: Subject to any disclaimer, the term of this patent is extended or adjusted under 35 U.S.C. 154(b) by 0 days.

(21) Appl. No.: 09/425,509

(22) Filed: Oct. 22, 1999

(51) Int. Cl.[7] .................................................. H04Q 1/00
(52) U.S. Cl. ....................... 340/825; 242/118; 714/724; 340/825.01; 340/2.26; 340/3.1; 340/517
(58) Field of Search .................................. 342/118, 127; 347/15; 714/724, 739, 741; 340/825, 825.01, 2.1, 2.2, 2.21, 2.26, 3.1, 517, 521

(56) References Cited

U.S. PATENT DOCUMENTS

| | | | | |
|---|---|---|---|---|
| 4,868,412 A | * | 9/1989 | Owens | 307/141 |
| 4,890,167 A | * | 12/1989 | Nakazato et al. | 358/443 |
| 4,967,367 A | * | 10/1990 | Piednoir | 716/2 |
| 5,847,969 A | * | 12/1998 | Miller et al. | 716/17 |

\* cited by examiner

*Primary Examiner*—Daryl Pope
(74) *Attorney, Agent, or Firm*—Visteon Global Tech., Inc.

(57) ABSTRACT

A component selector assembly 10 which pseudo-randomly energizes components 40–54 use of received data 60.

19 Claims, 2 Drawing Sheets

COMPONENT SELECTOR ASSEMBLY

(1) FIELD OF THE INVENTION

This invention relates to a component selector assembly and more particularly, to an assembly which pseudo-randomly selects components and which causes the selected components to selectively and cooperatively generate a signal.

(2) BACKGROUND

It is often desirable to pseudo-randomly select signal generating components or elements, such as transistors, in order to substantially prevent or reduce the correlation between the identity of the selected components or elements and the value of the selection signal (e.g. in order to prevent the same signal generating elements from being selectively activated each time or substantially each time that the selection signal is of a certain value).

This correlation is particularly undesirable, for example and without limitation, in digital-to-analog converters. That is, these converters typically receive data, such as "thermometer type data", which represents a certain value and which is used to energize one or more selectively energizable components and/or elements, thereby allowing and/or causing the selected elements and/or components to cooperatively provide an analog output signal. Since the signal generating components and/or elements are not exactly identical and/or are "mismatched", if the same components and/or elements are energized each time that the received data (e.g., the thermometer type data) is of a certain value, distortion is created within the converter, (e.g. the thermometer data is "correlated" with the selectively energizable components or elements), thereby causing an undesirable and inaccurate output signal.

There is therefore a need to pseudo-randomly select the selectively energizable components or elements in an efficient and cost effective manner, thereby decreasing and/or substantially eliminating the correlation between the received input data and the identity of the signal producing elements or components which are activated in response to the received data.

SUMMARY OF THE INVENTION

It is a first object of the invention to provide a method and an apparatus for selecting signal generating components and/or selectively energizable elements which overcomes some or all of the previously delineated drawbacks of such prior methods, techniques, and/or apparatuses.

It is a second object of the invention to provide a method and an apparatus for pseudo-randomly selecting signal generating components and/or elements which overcomes some or all of the previously delineated drawbacks of such prior methods, techniques, and/or apparatuses and which is accomplished in a relatively cost efficient manner.

It is a third object of the invention to provide a digital-to-analog converter which has substantially less distortion than prior digital-to-analog converters.

According to a first aspect of the present invention, an apparatus for use in combination with data is provided. The apparatus includes several selectively activated signal generating elements; and a randomizer which receives the data and which is coupled to the several selectively activated signal generating elements, which splits the data into at least a first and a second portion, and which utilizes the first portion to pseudo-randomly select at least one of the several selectively activated signal generating elements and which utilizes the second portion to pseudo-randomly select at least a second one of the several selectively activated signal generating elements.

According to a second aspect of the present invention a method for selecting signal generating elements is provided. The method includes the steps of placing each of the signal generating elements into one of two groups; and pseudo-randomly selecting a first of the signal generating elements from a first of the two groups and pseudo-randomly selecting a second of the signal generating elements from a second of the two groups.

These and other aspects, features, and advantages of the present invention will become apparent from a reading of the following detailed description of the preferred embodiment of the invention and by reference to the following drawings.

DETAILED DESCRIPTION OF THE PREFERRED EMBODIMENT OF THE INVENTION

Figure 1:
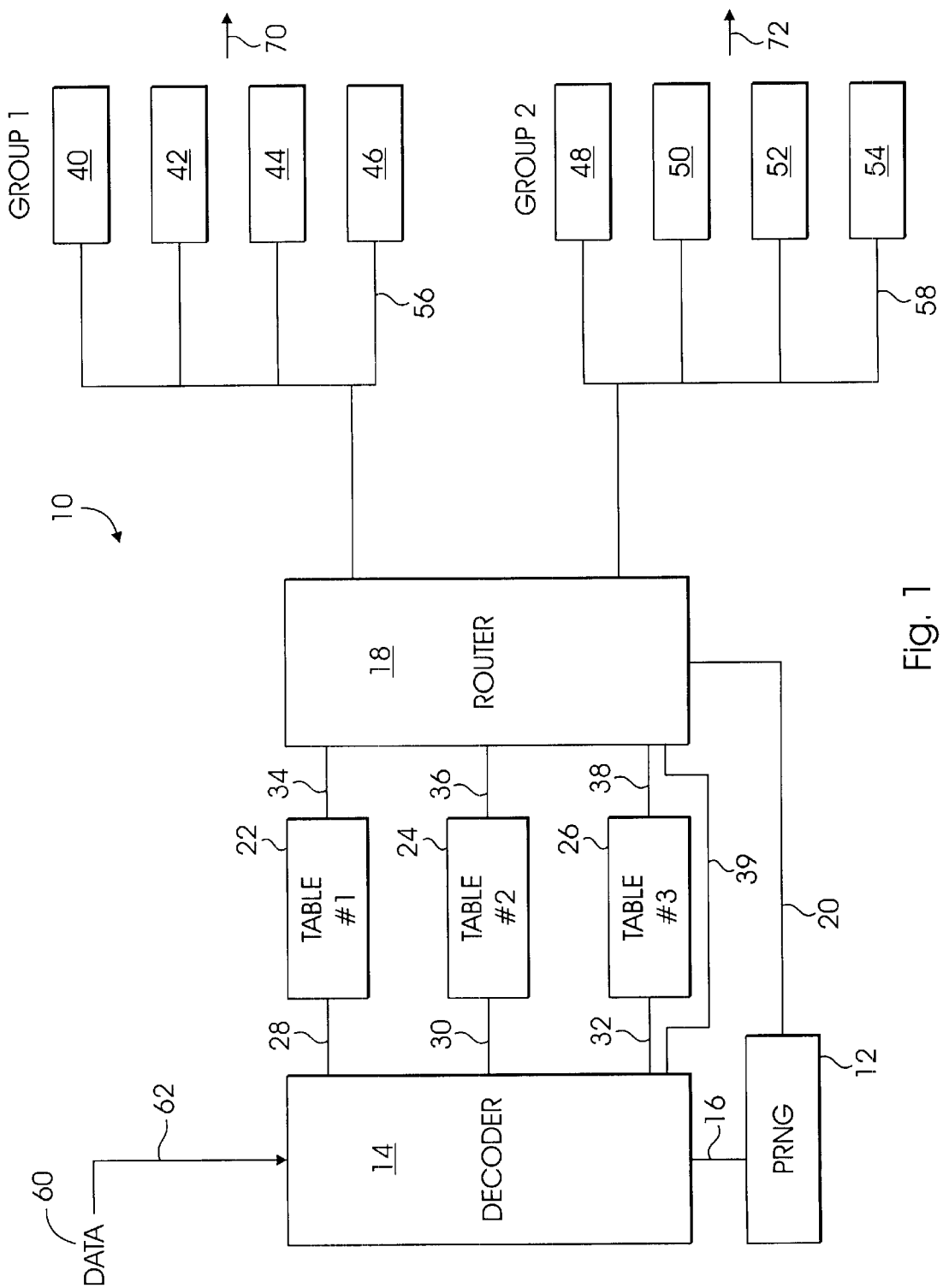
FIG. 1 is a block diagram of a component selector assembly which is made in accordance with the teachings of the preferred embodiment of the invention.

Referring now to FIG. 1, there is shown a signal generating component and/or element selector assembly 10 which is made in accordance with the teachings of the preferred embodiment of the invention. As shown, assembly 10 includes a conventional pseudo-random number generator 12 which is communicatively coupled to a decoder assembly 14 by the use of bus 16. Assembly 10 further includes a router assembly 18 which is communicatively coupled to the pseudo-random number generator 12 by bus 20. It should be appreciated that, in one non-limiting embodiment of the invention, decoder 14 and router 18 may comprise a microprocessor and/or a controller assembly operating under stored program control and having a certain amount of buffer or temporary storage memory.

Further, assembly 10 includes several tables 22, 24, and 26, which may be operatively contained, for example and without limitation, within a microprocessor and/or which may comprise conventional selectively addressable and distinct and/or separate memory assemblies, which are respectively and communicatively coupled to decoder assembly 14 by busses 28, 30, and 32, and which are respectively and communicatively coupled to the router assembly 18 by busses 34, 36, and 38. Decoder 14 is further coupled to router 18 by bus 39. Assembly 10 also includes signal generating components or elements 40, 42, 44, 46, 48, 50, 52, and 54 (e.g., transistors) which are selectively energizable and which are each adapted, when selectively energized, to respectively generate signals 70, 72. Particularly, in one non-limiting embodiment, signals 70, 72 cooperatively form an "analog conversion" signal associated with the input data or input data signal 60, which is communicated to decoder 14 by use of bus 62. Decoder 14, router 18, pseudo-random number generator 12, and tables 22–26 may be considered to cooperatively comprise a "randomizer" which pseudo-randomly and energizably selects components or elements 40–54, and which selectively energizes these components or elements 40–54 in response to the receipt of the input data 60.

Particularly, in one non-limiting embodiment of the invention, selectively energizable components or elements 40, 42, 44, and 46 are included in a first component group, denoted as "Group 1", and are communicatively coupled to router assembly 18 by bus 56, while components or elements 48, 50, 52, and 54 are included within a second component group, denoted as "Group 2", and are communicatively coupled to router assembly 18 by bus 58. It should be realized that a different number of components 40–54 may be used within the assembly 10 and that a different number of component groupings may be used, depending upon the application within which assembly 10 is to be operatively used. Hence, this invention is not to be limited by the number of components 40–54 nor by the number of component groups which are shown, by way of example and without limitation, in FIG. 1.

Further, it should be realized that the assembly 10 is adapted to receive digital type data, such as by way of example and without limitation thermometer type data 60, which is communicated to decoder assembly 14, and that assembly 10, in this non-limiting embodiment, forms and/or comprises a digital-to-analog converter. It should however be further realized that the component selection methodology, included within this assembly 10, is not limited to use within a digital-to-analog converter but, rather, may be employed in a number of diverse types of electrical, electronic, and/or computer assemblies requiring various types of components to be chosen and/or selected and/or selectively energized, and therefore has a relatively wide use and/or applicability. Moreover, while the following discussion will now describe the use of thermometer data 60 within assembly 10, it should be appreciated that the component selection functionality of assembly 10 may be used with a wide variety of data having various amounts of data bits and/or patterns.

The thermometer data 60 specifies the number of elements 40–54 which are required to be activated and is communicated to the decoder 14 by use of the bus 62. In the preferred embodiment of the invention, the received thermometer data 60 comprises and/or forms an eight-bit binary segment (e.g., each bit has a value of "0" or "1" ). The received eight bits of binary data are divided or "split", by decoder 14, into two substantially equal halves. Other segmentation patterns may be, of course, be utilized.

That is, in this non-limiting embodiment, each bit of the received eight bits of data 60 is placed into a unique one of these two "bit segment halves" or "bit segments". The identity of the "bit segment", into which a bit of the received data 60 is to be placed within, is substantially and pseudo-randomly selected, in one non-limiting embodiment, by data emanating from the pseudo-random number generator 12. For example and without limitation, the pseudo-random data, on bus 16, is binary. A currently received and pseudo-randomly generated bit value of "0" causes the currently received bit of data 60 to be placed into the first bit segment, while a currently received pseudo-randomly generated bit value of "1" causes the currently received data bit to be placed into the second bit segment. Decoder 14 ensures that each bit segment has four bits, by forcing data bits to occupy and/or be placed within a certain bit segment if the other bit segment is full. Hence, two four-bit segments are formed each time that eight-bits of thermometer data 60 is received.

In the preferred embodiment of the invention, table 22 includes all possible combinations of three activated or logically high values and one logically low value. More particularly, table 22 contains the following discrete entries: (1,1,1,0; 0,1,1,1; 1,0,1,1; and 1,1,0,1). Table 24 includes all combinations of two activated or logically high values and two logically low values. More particularly, table 24 contains the following discrete entries: (1,1,0,0; 0,1,1,0; 0,0,1,1; 0,1,0,1; 1,0,1,0; and 1,0,0,1). Table 26 represents all combinations of one activated or logically high value and three logically low values. More particularly, table 26 contains the following entries: (1,0,0,0; 0,1,0,0; 0,0,1,0; and 0,0,0,1).

In operation, each four-bit data segment is used to access table data and/or comprises data which is uniquely associated with one of the component groups. The data which is accessed by use of the bit segments and/or which is contained within the bit segments, as explained below, is communicated to router 18 and forms two four bit component "energization segments". Each energization segment is uniquely associated with one of the component groups. Each energization segment is further used to define a number of elements which are to be activated within the respective and uniquely associated component or element group (e.g., Groups "1" or "2").

Particularly, if an energization segment has a value of "0000" then none of the elements 40–54 within the component group to which that energization segment is uniquely associated with are to be energized. If an energization segment has a value of "0001", "1000", "0010", "0100", then one element 40–54 within the component group to which that energization segment is uniquely associated with is to be activated. If an energization segment has a value of "1001", "0011", "0101", "0110", "1010", "1100", then two elements 40–54 within the component group to which that energization segment is uniquely associated with are to be activated. If an energization segment has a value of "0111", "1011", "1110", "1101", then three elements 40–54 within the component group to which that segment is uniquely associated with are to be activated. If an energization segment has a value of "1111", then four elements within the component group to which that energization segment is uniquely associated with are to be activated. Each of the bit segment patterns, created by decoder 14, create an energization segment which is independently applied to a unique one of the component groups, as explained below, thereby allowing elements 40–54 to be substantially and pseudo-randomly selected and/or activated.

Decoder 14 creates these two data bit segments and recognizes the bit patterns for each respective data segment. If the value of a bit segment is "0001", "0010", "0100", or "1000", then table 26 is accessed by decoder 14. If the value of a bit segment is "1001", "0011", "0101", "0110", "1010", or "1100", then table 24 is accessed by decoder 14. If the value of a bit segment is "10111"1, "1011", "1110", or "1101" then table 22 is accessed for that segment. No table 22–26 is selected or accessed, by decoder 14, due to a bit segment having a value of "0000" or "1111". Rather, these "non-table" bit-segment values are directly communicated to router 18 by use of bus 39. Hence, as shown below, each created bit segment causes one of the tables 22–26 to be accessed and to, more particularly, cause an entry within the respectively accessed tables 22–26, to be communicated to router 18, or causes its respective binary values to be directly communicated to router 18.

A second portion of the bits produced by the pseudo-random number generator 12, appearing on bus 16, is used by the decoder 14 to pseudo-randomly select an entry in a first of the tables 22–26 for the first bit segment and a second entry in a second of the tables 22–26 for the second bit segment, if such a table entry is required (i.e., if the respective bit segments do not have a value of "0000" or "1111"). It should be appreciated that the tables 22–24 may be used for each bit segment, thereby increasing the efficiency of the assembly 10. These table entry values are communicated to the router 18 by busses 34–38. Hence, router 18 contains two energization segments of data. Each energization segment was produced by a unique one of the bit segments in the foregoing manner.

A third portion of the data which is output from the pseudo-random number generator 12 is communicated to the router 18, by use of bus 20, thereby pseudo-randomly associating each of the energization segments (e.g., each comprising a previously selected table entry or a bit segment value of "0000" or "1111") with a unique one of the groups of elements 40–54. Hence, each of the four bit component energization segments are applied to a unique and selected one of the component groups "1" and "2" and causes energization of the components 40–54 in the following manner. For example, a pseudo-randomly generated bit of "0" causes the two energization segments to be applied to the component groups in a first manner (e.g., the first energization segment is applied and/or communicated to Group I while the second energization segment is applied and/or communicated to Group II) and a value of "1" causes the application to be reversed.

Each energization segment, contained within the router 18 as previously explained, comprises four-bits having respective positions which may be denoted as "$b_1$", "$b_2$", "$b_3$", and "$b_4$" (e.g., an energization segment of "0101" has a "0" in the "$b_1$" and "$b_3$" positions). The bit in position "$b_1$" is either associated with, applied to, and/or communicated to element 40 (if component group I is selected for this energization segment) or 48 (if component group II is selected for this energization segment), while the bit in position "$b_2$" of an energization segment is associated with, applied to, and/or communicated to element 42 (if component group I is selected for this energization segment) or 50 (if component group II is selected for this energization segment), the bit in position "$b_3$" is then associated with, applied to, and/or communicated to elements 44 (if component group I is selected for this engergization segment) or 52 (if component group II is selected for this energization segment), and the bit in position "$b_4$" is associated with, applied to, and/or communicated to elements 46 (if component group I is selected for this energization segment) or 54 (if component group II is selected for this energization segment). Particularly, a bit value of "1" causes the component and/or element 40–54, which receives the value, to be activated or energized, while a bit value of "0" causes the element or component 40–54, which receives the value, to remain unenergized. In this manner, each of the elements 40–54 is substantially and pseudo-randomly selected and selectively energized and the correlation with the data 60 is reduced, effective to produce output signals 70, 72 which cooperatively form an analog conversion signal having substantially less distortion and less noise than prior analog conversion signals.

Since the received data is "split" into two segments, the individual entries within the tables 22–26 and/or the combination of the tables 22–26 do not have a substantially equal probability of selection, thereby introducing some level or amount of distortion into the assembly 10 and decreasing the randomness of the selection methodology which is employed by the assembly 10. For example and without limitation, in this non-limiting embodiment, the combinations of tables 24 and 26 used to activate three elements, will occur more frequently (e.g. by a factor of 24:4 or 6:1) than will the use or combination of table 22 and the bit segment of "0,0,0,0".

Figure 2:
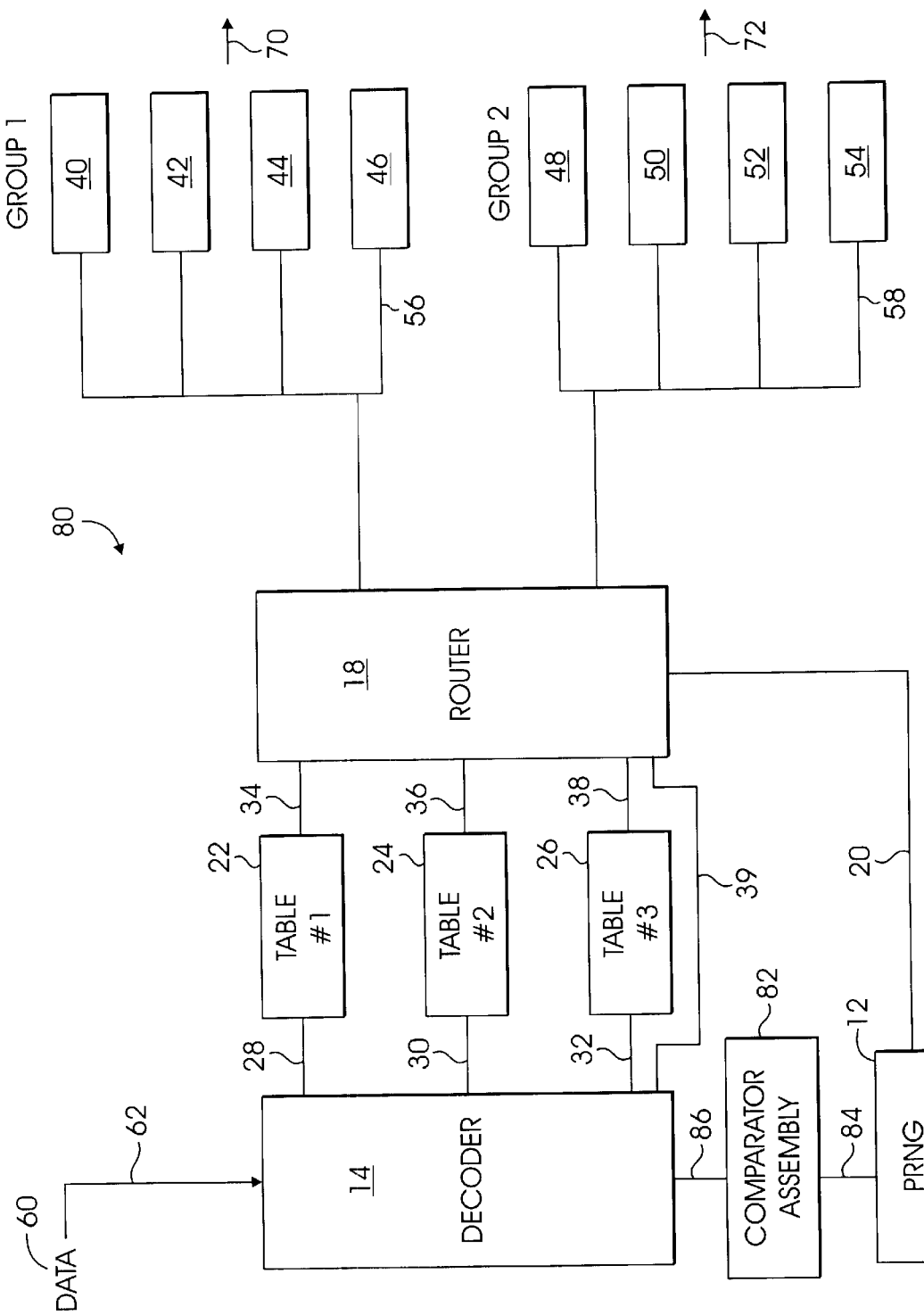
FIG. 2 is a block diagram of a component selector assembly which is made in accordance with the teachings of a second and alternate embodiment of the invention.

To address this drawback, in a second non-limiting embodiment of the invention, which is shown best in FIG. 2, a modified component selector assembly 80 may be created. As seen below, assembly 80 is substantially identical to assembly 10 with the exception of the addition of a comparator assembly 82. Components and/or portions of assembly 80 having like numbers, as found within assembly 10, refer to the same component, assembly portion, or element. The pseudo-randomly generated data, created by generator 12, is placed on bus 84 and is coupled to a comparator assembly 82 which provides table selection output data to decoder 14, on bus 86. In this non-limiting embodiment, each time that only three bits of the received thermometer data 60 are activated or are logically high (i.e., having a value of "1"), decoder 14 uses comparator 82 to create the bit segments. In this manner, as shown below, the use or combination of tables 22 and the bit segment of "0,0,0,0" is forced to be selected more frequently, by a correction factor of 6:1, than the combination of tables 24 and 26. That is, the data 60 is placed into bit segments in a manner which causes the combination of table 22 and the bit segment "0,0,0,0" to be selected more frequently than the combination of tables 22 and 24 (e.g., bit segment combinations having a first portion with three logically high values and a second portion with one logically low value are forced to occur more frequently than bit segment combinations having a first portion with two logically high values and a second portion with one logically high value).

That is, the data appearing on bus 82, in this embodiment of the invention, has ten binary bits which cooperatively generate values ranging from 0 to 1023. The comparator assembly 80 generates a table selection signal which causes table 22 and bit segment "0,0,0,0" to be selected every time the data has a value of 0 to about 853 and to generate a table selection signal, on bus 86, which causes tables 24 and 26 to be selected (corresponding to bit segments respectively requiring a single activated element and two activated elements) every time the data has a value of about 853 to about 1024. Hence, the tables 22–26 are selected with substantially uniform probability when only three bits of the received thermometer data 60 are activated. Similarly, corrective functionality may be achieved for other table selection combinations.

In a third non-limiting embodiment, the pseudo-random number generator 12 may be modified to further increase the range of applications to which system 10 may be applied. Particularly, if a number of pseudo-random generated states is required which does not correspond a mathematical "power of two" (e.g., such as 52), according to the principles of this third embodiment of the invention, the desired number of states may be "factored" by a first number which is a power of two (e.g. 4) and a second remainder number (e.g. 13). of course, the first number and the second remainder number must multiplicatively total the desired number of states.

A conventional pseudo-random number generator may then be used to construct and/or provide a number of states equal to the first number. A second conventional pseudo-random number generator may be used to generate the second required number of states (e.g., 13) by substantially and equally allocating or associating each of the actually provided states into a unique one of the desired states, such that each required state corresponds to at least one of the actually provided states. It is desirable to cause the number of desired states to be substantially equal to the number of provided states in order to reduce error. The bits of data emanating from these pseudo-random number generators are then merged.

Alternatively, a single pseudo-random number generator may be used to achieve this "non power of two" requirement. In this arrangement, the pseudo-random number generator is operated and is allowed to operatively output data only until the desired number of states is actually provided by the generator (e.g., 52). After the number of desired states and the concomitant output is achieved and/or provided, the pseudo-random number generator is reset.

It is to be understood that the invention is not limited to the exact embodiments which are illustrated and discussed above, but that various changes and modifications may be made without departing from the spirit and the scope of the following claims.

What is claimed is:

1. An apparatus for use in combination with generated data, said apparatus comprising:

a plurality of selectively activated signal generating elements; and a randomizer which receives said data and which is coupled to said plurality of selectively activated signal generating elements, which splits the received data into at least a first and a second portion, and which utilizes the first portion to pseudo-randomly select at least one of said plurality of selectively activated signal generating elements and which utilizes the second portion to pseudo-randomly select at least a second one of the plurality of selectively activated signal generating elements.

2. The apparatus of claim 1 wherein said first and said second portions are substantially identical.

3. The apparatus of claim 2 wherein said first and second portions each comprise eight bits.

4. The apparatus of claim 1 wherein said randomizer comprises a pseudo-random number generator.

5. The apparatus of claim 4 wherein said pseudo-random number generator generates a plurality of data, said randomizer further comprising an assembly, coupled to said pseudo-random number generator, which generates a first output value when said plurality of data is below a first threshold value and which generates a second output value when said plurality of data is above said first threshold value.

6. The apparatus of claim 1 wherein said data comprises thermometer data.

7. The apparatus of claim 1 wherein said elements are substantially identical.

8. The apparatus of claim 1 wherein said randomizer stores second data and uses said generated data to selectively energize said at least a first one of said plurality of said signal generating elements.

9. The apparatus of claim 1 wherein said randomizer comprises a first and a second pseudo-random number generator which cooperatively produces data.

10. A method for selecting signal generating elements comprising the steps of:

placing each of said signal generating elements in one of two groups; and pseudo-randomly selecting a first of said signal generating elements from a first of said two groups and pseudo-randomly selecting a second of said signal generating elements from a second of said two groups.

11. The method of claim 10 wherein each of said groups have a substantially equal number of elements.

12. The method of claim 10 wherein said step of pseudo-randomly selecting a first of said signal generating elements from a first of said two groups and pseudo-randomly selecting a second of said signal generating elements from a second of said two groups is performed using a pseudo-random number generator.

13. The method of claim 10 wherein said first group and said second group each comprise four signal generating elements.

14. A method to select components, said method to be used in combination with data, said method comprising the steps of:

providing selectively energizable components;

receiving said data;

uniquely and pseudo-randomly associating a first portion of said data with a first portion of said selectively energizable components; and uniquely and pseudo-randomly associating a second portion of said data with a second portion of said selectively energizable components.

15. The method of claim 13 wherein said data comprises thermometer data.

16. The method of claim 14 wherein said first and said second portions have substantially equal number of said selectively energizable components.

17. The method of claim 14 wherein said method further comprises selectively activating at least one of said first portion of said selectively energizable components.

18. The method of claim 14 wherein said data comprises data which is of the digital type.

19. The method of claim 17 wherein said first portion of said selectively energizable components generates data which is of the analog type.

* * * * *